United States Patent
Stephen et al.

[11] Patent Number: 6,014,682
[45] Date of Patent: Jan. 11, 2000

[54] METHODS AND APPARATUS FOR VARIABLE-RATE DOWN-SAMPLING FILTERS FOR DISCRETE-TIME SAMPLED SYSTEMS USING A FIXED SAMPLING RATE

[75] Inventors: Karen J. Stephen, Carlsbad; Alok Gupta, Encinitas; Jonathan Cromwell, Cardiff By The Sea, all of Calif.

[73] Assignee: International Business Machines Corporation, Armonk, N.Y.

[21] Appl. No.: 08/866,590

[22] Filed: May 30, 1997

[51] Int. Cl.[7] .................................................... G06F 17/10
[52] U.S. Cl. ............................................ 708/313; 708/276
[58] Field of Search ................................ 364/724.1, 721; 708/313, 276

[56] References Cited

U.S. PATENT DOCUMENTS

| | | | |
|---|---|---|---|
| 4,323,980 | 4/1982 | Houdard et al. | 364/724.1 |
| 4,954,824 | 9/1990 | Yamada et al. | 364/724.1 |
| 5,010,506 | 4/1991 | Hrncirik | 364/721 |
| 5,548,540 | 8/1996 | Staver | 364/724.1 |
| 5,563,815 | 10/1996 | Jones | 364/721 |
| 5,768,311 | 6/1998 | Betts | 364/724.1 |

OTHER PUBLICATIONS

"Multirate Digital Signal Processing", Prentice–Hall, pp. 31–35, 79–91 (1983).
"Interpolation in Digital Modems—Part I: Fundamentals", Gardner, IEEE Trans. on Comm., vol. 41, No. 3 (Mar. 1993) pp. 501–507.
"Interpolation in Digital Modems—Part II: Implementation and Performance", Erup et al., IEEE Trans. on Comm., vol. 41, No. 6 (Jun. 1993) pp. 998.
"Multirate Analog–Digital Systems for Signal Processing and Conversion", Franca et al., Proceedings of the IEEE, vol. 85, No. 2 (Feb. 1997) pp. 242–261.

*Primary Examiner*—David H. Malzahn
*Attorney, Agent, or Firm*—Blakely, Sokoloff, Taylor & Zafman LLP

[57] ABSTRACT

Methods and apparatus for variable-rate down-sampling filters for discrete-time sampled systems using a fixed sampling rate are disclosed. The Variable Rate Down-Sampling Filter allows a continuous range of sample rates to be derived from input samples at a fixed rate. The output rate does not have to be related to the fixed input rate in any integral or rational way, and in fact, the output rate can vary in time such as will occur when tracking a signal received from a station using a different timebase. A fixed sampling rate at the A/D Converter greatly simplifies the design of the analog front end. A single anti-aliasing filter can be designed and precisely matched to the fixed sampling rate. Used with a frequency-modulated numerically controlled oscillator (NCO), the Down-Sampling Filter keeps the entire frequency-synthesis and time-tracking loop in the digital domain. The need for an analog time-tracking loop to adjust the sampling instant at the A/D converter is eliminated. The need for an analog frequency synthesizer to generate a variable sampling rate is also eliminated. System design and performance analysis are simplified as well by eliminating the complication of hybrid analog-digital control loops. Details are disclosed.

31 Claims, 11 Drawing Sheets

METHODS AND APPARATUS FOR VARIABLE-RATE DOWN-SAMPLING FILTERS FOR DISCRETE-TIME SAMPLED SYSTEMS USING A FIXED SAMPLING RATE

BACKGROUND OF THE INVENTION

1. Field of the Invention

The present invention relates to the field of digital communications.

2. Prior Art

In a digital communications system, the function of the demodulator is to extract the digital information from a modulated analog waveform. In the past, the demodulation function has been accomplished using analog signal processing techniques (mixers, filters, phase-locked-loops, etc.). With the advent of high-speed digital technology, it now possible to perform much of the demodulation function using discrete-time or digital signal processing (DSP) techniques. Where an analog demodulator must be custom-tailored to the specific characteristics of a particular signal to be demodulated, a digital demodulator allows great flexibility in reprogramming to meet the requirements of a variety of systems having different modulation types, channel characteristics, data rates, etc.

In a digital demodulation system, the process typically begins by sampling the analog waveform at a rate $F_s$ samples/sec and digitizing its amplitude using an A/D (analog-to-digital) converter. Then the digitized samples are processed through various mathematical operations to extract the required information bits. The processing operations usually include some type of filtering to compensate for the effects of channel conditions or modulation technique, as well as for the artifacts introduced by the sampling process itself. It is usually necessary to recover the timing (symbol rate) of the information bits from the received signal because the precise timing is not known at the receiver. This means that the symbol rate may not necessarily be related to the sampling rate. Furthermore, the symbol rate may not be constant over time; it may vary somewhat due to imperfections in the timebases at the transmitter and receiver or relative motion between the transmitter and receiver.

According to the Nyquist criterion, the sampling rate must be at least twice the highest frequency content of the desired signal. In a digital system, the sampling rate must be at least equal to the symbol rate, or greater, for better performance. Typically, in current practice, a sampling rate is chosen which is an integer multiple N of the symbol rate, so that it is easy to reduce or decimate the sampling rate by retaining only every Nth sample and throwing out all others. If a range of symbol rates is desired, then there must be circuitry to generate a range of corresponding sampling clocks. Since the exact timing of the received symbols is generally not known, the sampling clock circuitry must also be capable of slewing in time to adjust the sampling instant to the optimal point.

The decimation process also requires a filter that selects the desired signal components. The filtering can always be done before the decimation but this requires a very large computation to be performed at the higher sampling rate. There are well-known methods in which the decimation-by-N operation can be done before the filter (predecimation) so that a smaller computation involving only every Nth sample can be performed at the lower decimated rate. In order to achieve the greatest computational efficiency, certain restrictions must be followed, mainly that such a filter can be designed to work only for one particular decimation ratio, and there is no provision for adjusting the sampling instant.

Floyd M. Gardner, "Interpolation in Digital Modems— Part I: Fundamentals" (Floyd M. Gardner, *IEEE Transactions on Communications*, Vol. 41, No. 3, March 1993) describes an embellishment to the predecimation method, in which a numerically-controller oscillator (NCO) is used to select which samples to process and to generate or look up the appropriate coefficients. This modification to the basic method allows for non-integral decimation ratios and for the slewing in time of the apparent sampling instant, while preserving the computational efficiency of predecimation. But since the samples are predecimated, the filter must be designed for the particular decimation ratio. If a selection of different ratios is desired, a different set of coefficients must be provided for each ratio. The number of taps, or length, of the filter may need to change too, to maintain performance requirements over the range of decimation ratios.

BRIEF SUMMARY OF THE INVENTION

The present invention addresses the combined operations of filtering and timing recovery in a digital demodulator. In particular, this invention addresses the following operations:

1. matched-filtering for equalization or wave-shaping;
2. (sine x)/x filtering for interpolation/decimation;
3. resampling to convert from input sampling rate $F_s$ to a lower, not necessarily commensurate, output rate $F_o$;
4. symbol time synchronization.

The Variable Rate Down-Sampling Filter of the present invention allows a continuous range of sample rates to be derived from input samples at a fixed rate. The output rate does not have to be related to the fixed input rate in any integral or rational way, and in fact, the output rate can vary in time such as will occur when tracking a signal received from a station using a different timebase. A fixed sampling rate at the A/D Converter greatly simplifies the design of the analog front end. A single anti-aliasing filter can be designed and precisely matched to the fixed sampling rate. Used with a frequency-modulated numerically controlled oscillator (NCO), the Down-Sampling Filter keeps the entire frequency-synthesis and time-tracking loop in the digital domain. The need for an analog time-tracking loop to adjust the sampling instant at the A/D converter is eliminated. The need for an analog frequency synthesizer to generate a variable sampling rate is also eliminated. System design and performance analysis are simplified as well by eliminating the complication of hybrid analog-digital control loops.

With respect to the decimation process, there are well-known methods involving predecimation of the samples before filtering, which have the effect of reducing the amount of computation necessary to produce decimated samples of a particular quality. But these methods restrict the decimation ratio to a fixed value because the filter characteristic must be designed for this ratio. The present invention does not predecimate, so it is not restricted to a fixed ratio, but because of this, it is less efficient in terms of computational effort than the predecimation methods. However, the preferred embodiment of the present invention distributes the extra computational burden in a parallel-processing architecture suitable for a compact and efficient implementation in VLSI in such a way that the physical complexity of the circuit is not much different than that of a circuit employing the predecimation method.

DETAILED DESCRIPTION OF THE INVENTION

Figure 1A:
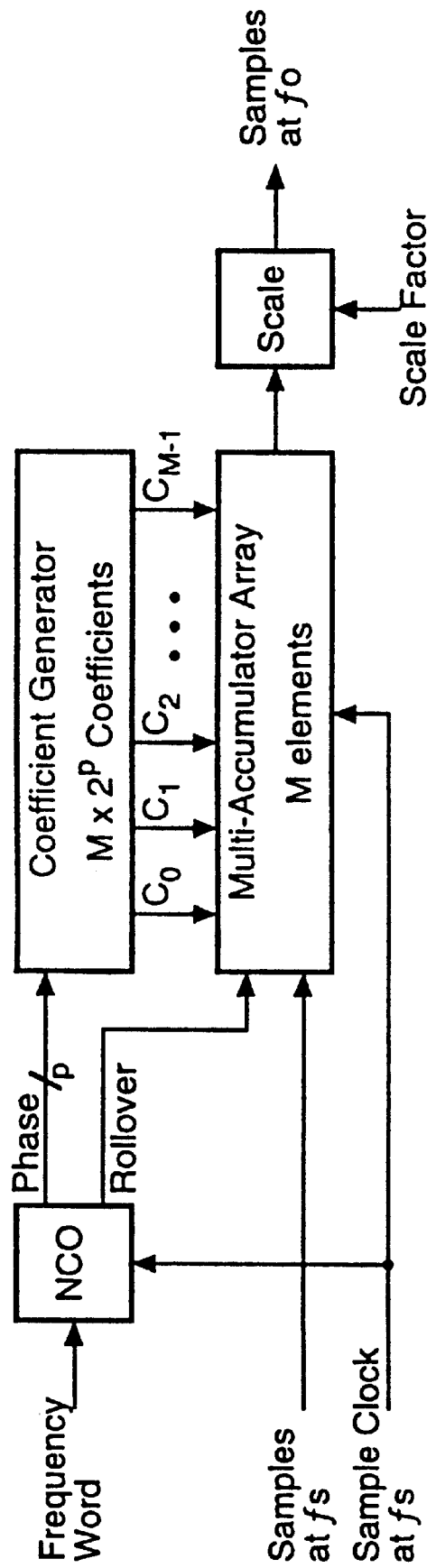
FIGS. 1a, 1b, 1c and 1d are block diagrams of the Variable-Rate Down-Sampling Filter of the present invention, FIG. 1a applying to a single channel system, FIG. 1b applying to a two channel system such as a quadrature modulated system wherein the two channels have the same characteristics, FIG. 1c applying to a two channel system wherein channels A and B have the different characteristics, and FIG. 1d applying to a system wherein multiple coefficient generator-multiplier/accumulator units may be cascaded.
Figure 1B:
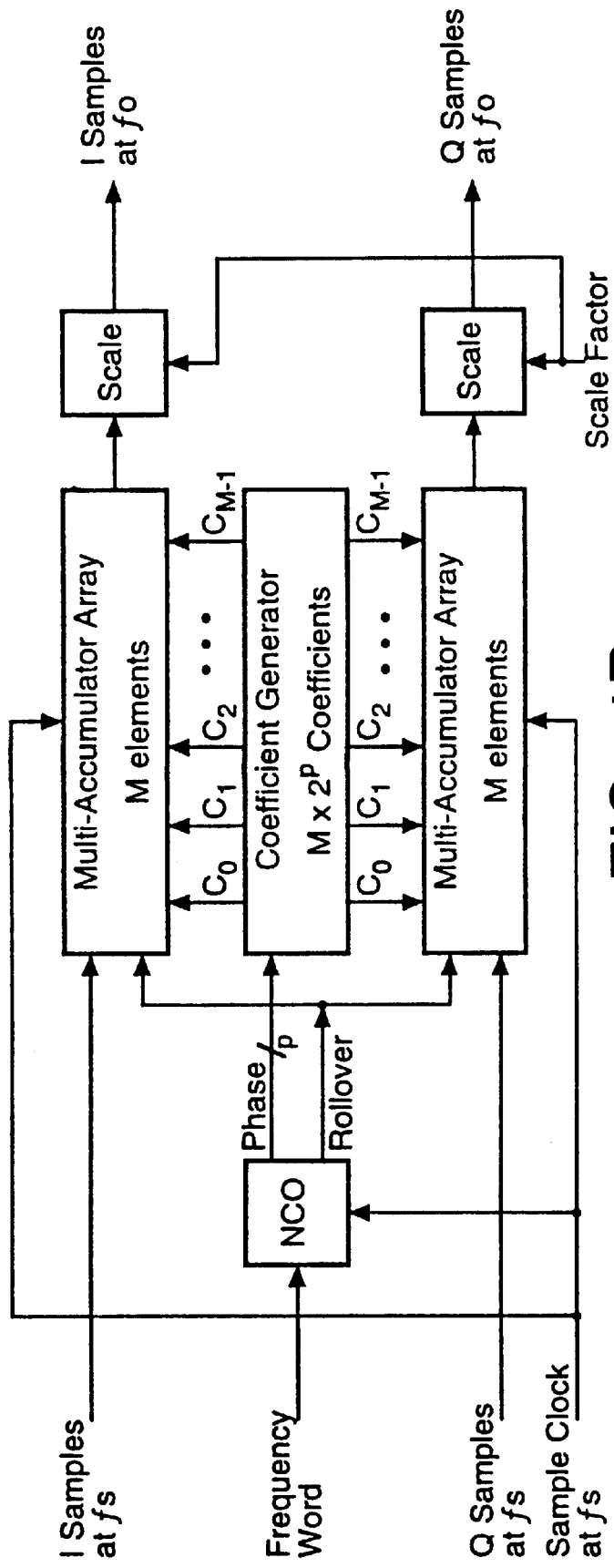
Figure 1C:
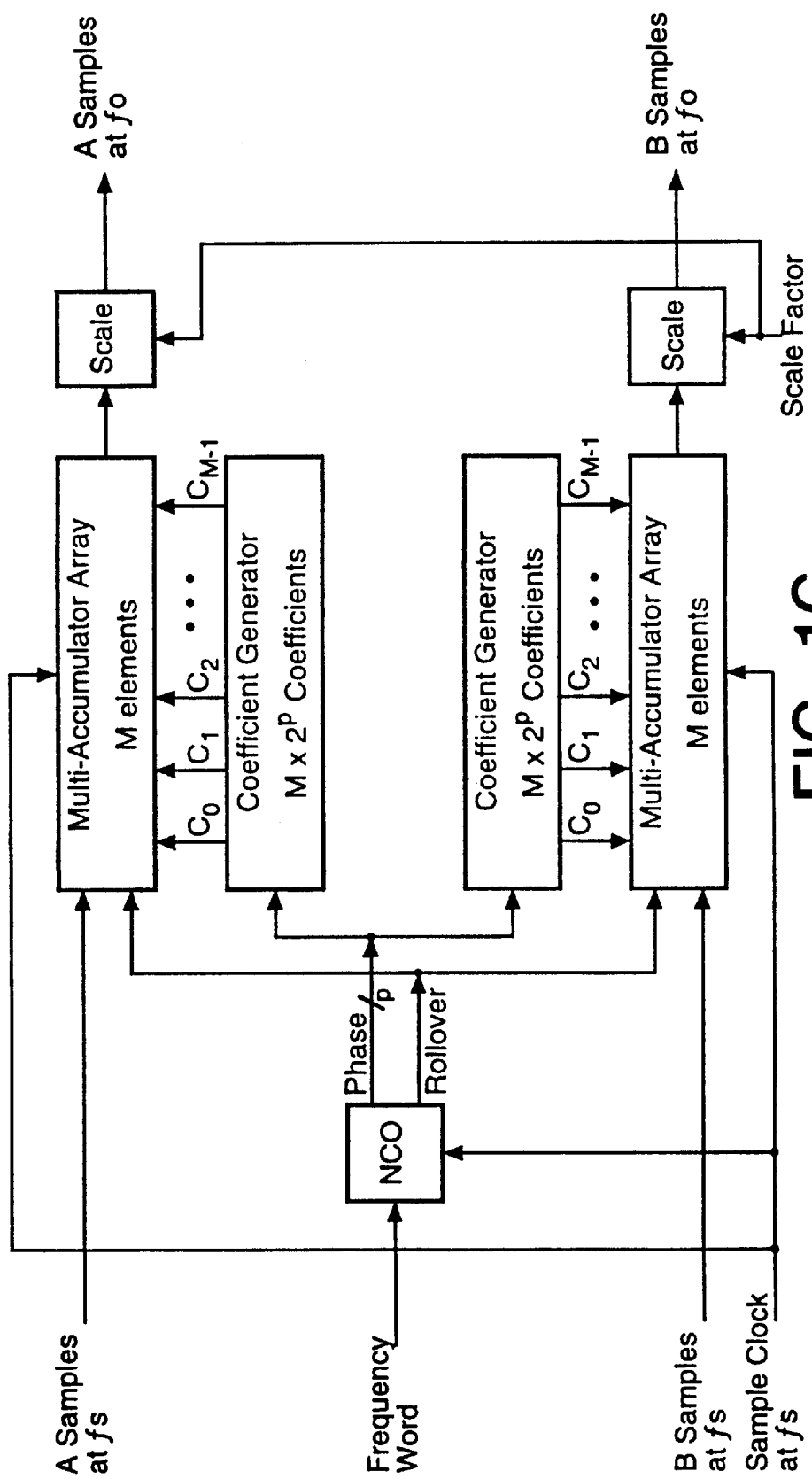

First referring to FIG. 1a, the Variable-Rate Down-Sampling Filter of the present invention contains four major components: a Numerically-Controlled Oscillator (NCO), a Coefficient Generator, a cascade of Multiplier-Accumulator (MAC) elements, and an output Scaler. In a quadrature-modulated system where there are two channels (I and Q) of samples, a separate MAC array is required for each channel. But if the symbol rate and filtering requirements are the same on both channels, they can share the same coefficient generator, as shown in FIG. 1b. Even if the multiple channels have different characteristics, a common NCO can be used to drive multiple coefficient generators and multiplier-accumulator chains, as shown in FIG. 1c. While the two channels shown use the same value of M and the same width of address P to the coefficient generator, either or both P and M may be different for the two channels, though with the same sample rate, the same considerations would normally yield the same values of M and P for the two channels. Also the two coefficient generators, because they are addressed with the same address, may be a single RAM or ROM, in the example shown in FIG. 1c being $2 * M * 2^P$ bits wide to output the two sets of coefficients simultaneously.

Figure 1D:
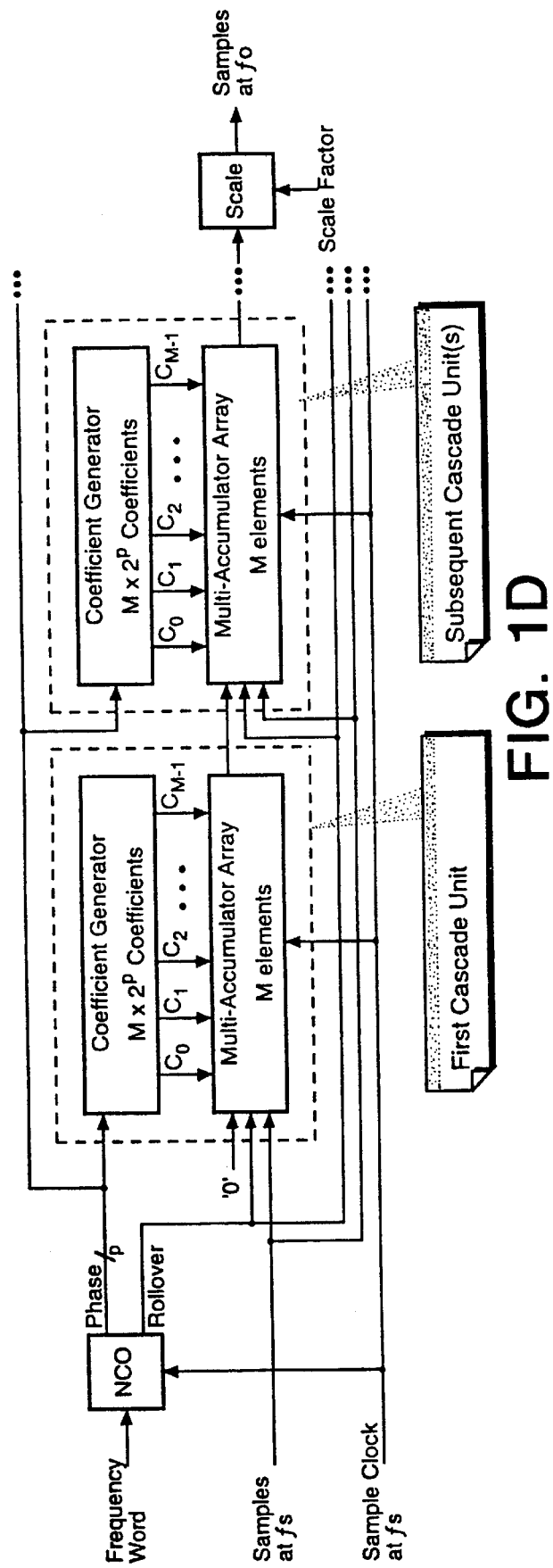

If the coefficient generator-multiplier/accumulator units are implemented as a unit, for example, as a VLSI circuit, multiple such units can be cascaded serially to increase the overall length of the filter, as shown in FIG. 1d. In this case, the output of each unit feeds the initial value of the next, and all units share the same input samples and the same phase and rollover signals from the numerically controlled oscillator. This embodiment would normally be used with RAM based coefficient generators, as the appropriate coefficients will depend on whether a particular MAC array and coefficient generator is being used alone or cascaded to another MAC array and coefficient generator. Note that such cascading may be under program control in a processor based system, so as to make the system reconfigurable under program control.

Figure 2:
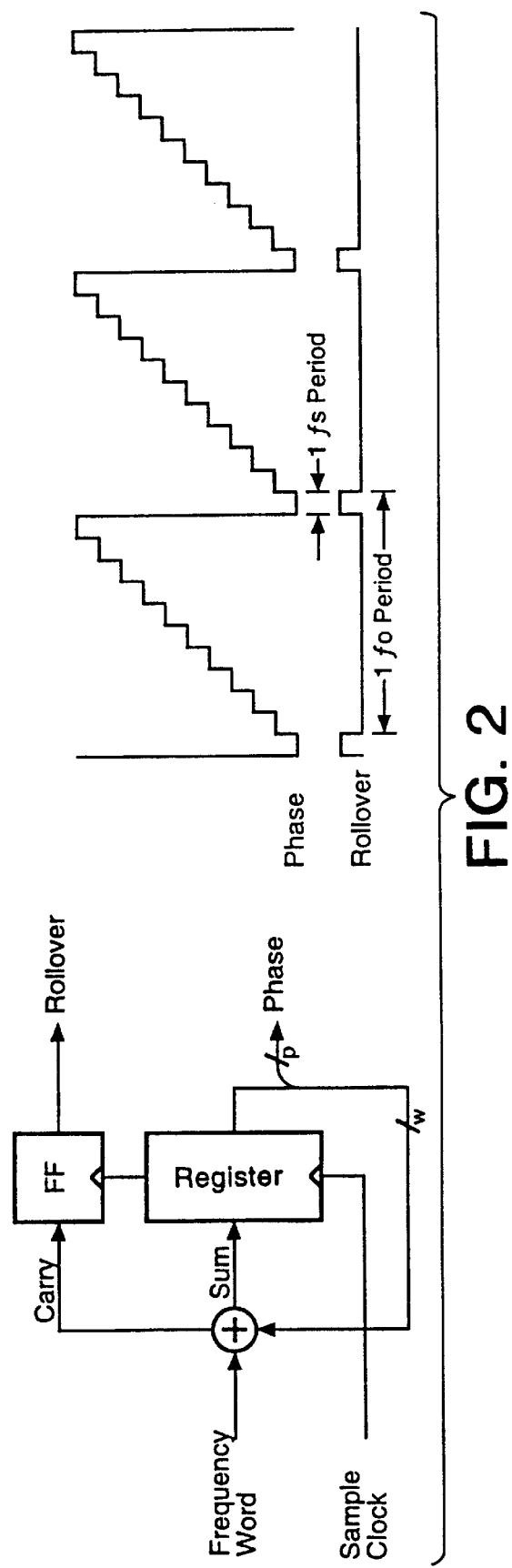
FIG. 2 is a block diagram of the Numerically Controlled Oscillator (NCO) used in the Variable-Rate Down-Sampling Filter of FIG. 1A–1D.

The Numerically Controlled Oscillator (FIG. 2)

The Numerically Controlled Oscillator (NCO) generates timing and phase information for the Filter. As shown in FIG. 2, the NCO is a large accumulator, consisting of an adder followed by a Register. The contents of the Register are fed back to one input of the adder. The other input of the adder is the value (Frequency Word) to be accumulated. The Register is clocked by the Sample Clock. At every clock tick, the value in the accumulator Register is incremented by the value presented at the input. When the accumulator increments past the top of its range, it "rolls over" and returns to the bottom. Thus the value of the accumulator Register traces out a periodic ramp or "sawtooth" function. The value of this Register at any given time relative to its full range represents the "phase" of the periodic function, and the interval between rollovers is one cycle or period of the function. The rate at which the ramp increases, and therefore the frequency at which it rolls over, is determined by the increment value presented at the input to the accumulator. The increment value, called the Frequency Word, can be constant, or it can be varied in response to some external control. In the former case, the NCO generates a fixed frequency. In the latter, the NCO is frequency-modulated and behaves very much like the Voltage-Controlled Oscillator (VCO) commonly found in analog frequency-synthesis circuits.

The Rollover frequency that the NCO generates is given by the relation:

$$F_o = (\text{Frequency\_Word}/2^W) * F_s$$

where:

$F_o$=the generated (Rollover) frequency Frequency_Word=the binary value of the increment input W=the width, in bits, of the NCO accumulator (Register and adder)

$F_s$=the frequency of the sampling clock

The precision of the NCO, that is, how exactly it can represent a desired frequency, depends on the size of the accumulator. With an accumulator W bits wide, the NCO can represent any frequency with the precision of one part in $2^W$ of the reference frequency $F_s$. The interval between rollovers is not necessarily constant, but the average interval $T_{avg} = F_s/F_o$ over a long time is a reasonably accurate representation of the desired frequency $F_o$.

While the frequency and period (1/frequency) of a periodic waveform are generally considered to be continuous quantities, the period that the NCO generates is discretized. The interval between rollovers is naturally an integral number of cycles of $F_s$, the sample clock. However, if $F_o$ is not an exact divisor of $F_s$, the interval will not be constant; it will jitter between T and T+1 cycles of $F_s$, where T is the integer part of $F_s/F_o$. But in the long term, the distribution of periods of length T and periods of length T+1 will be such that the average period approximates the true value of $F_s/F_o$, and therefore the frequency that the NCO generates approaches the true frequency $F_o$.

Figure 3:
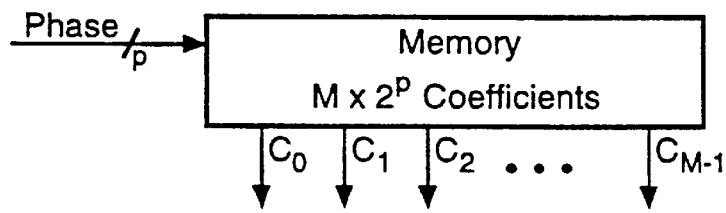
FIG. 3 is a block diagram of the Coefficient Generator used in the Variable-Rate Down-Sampling Filter of FIG. 1a–1d.

The Coefficient Generator (FIG. 3)

As may be seen in FIG. 3, the coefficients for the Filter are stored in a lookup table. The lookup table may be either fixed (ROM-based), or programmable (RAM-based) as shown in the Figure. The width of the table M is determined by the number of MAC elements in the Filter and the required precision (width in bits) of the coefficients; the depth is determined by the required resolution in time. At every tick of the sampling clock, the NCO generates a new phase value. At each tick, the coefficients for all the elements are looked up simultaneously using the NCO phase as the index into the lookup table. In a two channel system such as in FIG. 1b, wherein the channel characteristics are the same, only the data (samples) are different, the same coefficients are used for the two channels, as shown in FIG. 1b.

The NCO phase accumulator (the Register of FIG. 2) is generally quite large (32 bits is typical) in order to provide a reasonably accurate representation of any frequency, but the Variable-Rate Down-Sampling Filter does not require this much precision for acceptable performance. The time resolution required is determined by the performance requirements of the system in which the present invention is used, but is generally far less than the full precision of the NCO. Therefore, the NCO phase word (Phase output of FIG. 2) can be truncated and only a few most-significant-bits (P bits, where P<<W) are needed to index the coefficient lookup table.

Figure 4:
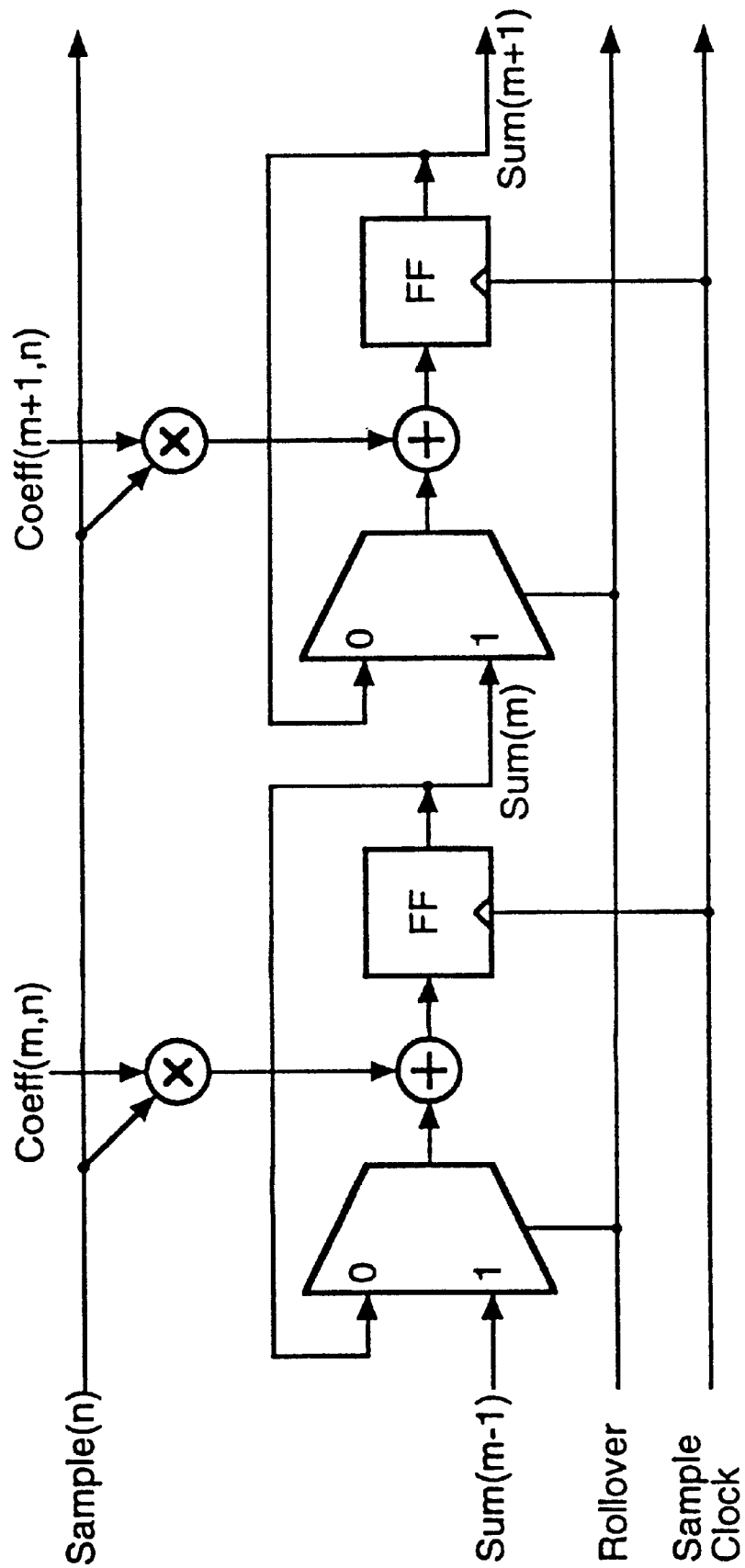
FIG. 4 is a block diagram of the Multiplier-Accumulator Elements used in the Variable-Rate Down-Sampling Filter of FIG. 1A–1D.

The Multiplier-Accumulator (MAC) Chain (FIG. 4)

The heart of the filter is the chain of M Multiplier-Accumulator (MAC) elements shown in FIG. 4. The number of elements M in the chain is to be determined by system requirements for the characteristics of the filter function. Each element has a multiplier, an accumulator, and an input selector or mux SEL. At every tick of the sampling clock, a new Sample (n) arrives at the Filter input. The new sample is distributed to all the MAC elements simultaneously and applied to one input of each element's multiplier. The other input of each multiplier is that element's coefficient for that time instant, from the coefficient table in the coefficient generator (FIG. 3). Each multiplier's product is then added to that element's accumulator. The input selectors SEL at each element choose which accumulator sum the multiplier product is to be added to: either the element's own accumulator or that of the previous element. Most of the time, between NCO rollovers, the contents of the registers FF are fed back through the selectors SEL to be added to the next product for that MAC element, so that the products are added to the local accumulator. Thus the sum grows in the element's own register FF. But when the NCO rolls over, the selectors SEL select their alternate inputs to cause the sum at each element to be shifted down the chain to the next element in line, with a final sum emerging from the last element in the chain. (For the first MAC element in the chain, the rollover will cause the selector SEL to couple a fixed value to the respective adder, typically zero, though an offset of some value could be entered as desired to overcome some equal and opposite offset in the samples or for some other reason.)

In this manner, the final sum is the total of all the elements for the last M periods of the NCO. If T is the number of samples per NCO period, then the total number of samples in the sum, assuming T were constant, would be MT. A final sum emerges at each rollover and these sums represent the rate-converted samples at the new down-sampled rate.

The accumulators must be sized to contain the growth of the accumulating sums caused by both the local accumulation and by the propagation down the chain. The growth from propagation down the chain is bounded not so much by the length of the chain, but by the nature of the Filter's impulse response, that is, by the magnitudes of the coefficients. The growth from the local accumulation is bounded by the maximum amount of rate-reduction intended.

Output Scaling a (FIGS. 1a and 1b)

Each rate-reduced output sample is a sum of a variable number of terms, depending on the ratio of input to output sample rate, that is, the average interval T between NCO rollovers. Because the number of terms is not constant, the gain of the Filter is not constant. Therefore, in order to use this Filter for different output rates, it may be necessary to add a scaling multiplier with an adjustable scale factor to normalize the magnitudes of the output samples over the expected range of output rates.

Figure 5:
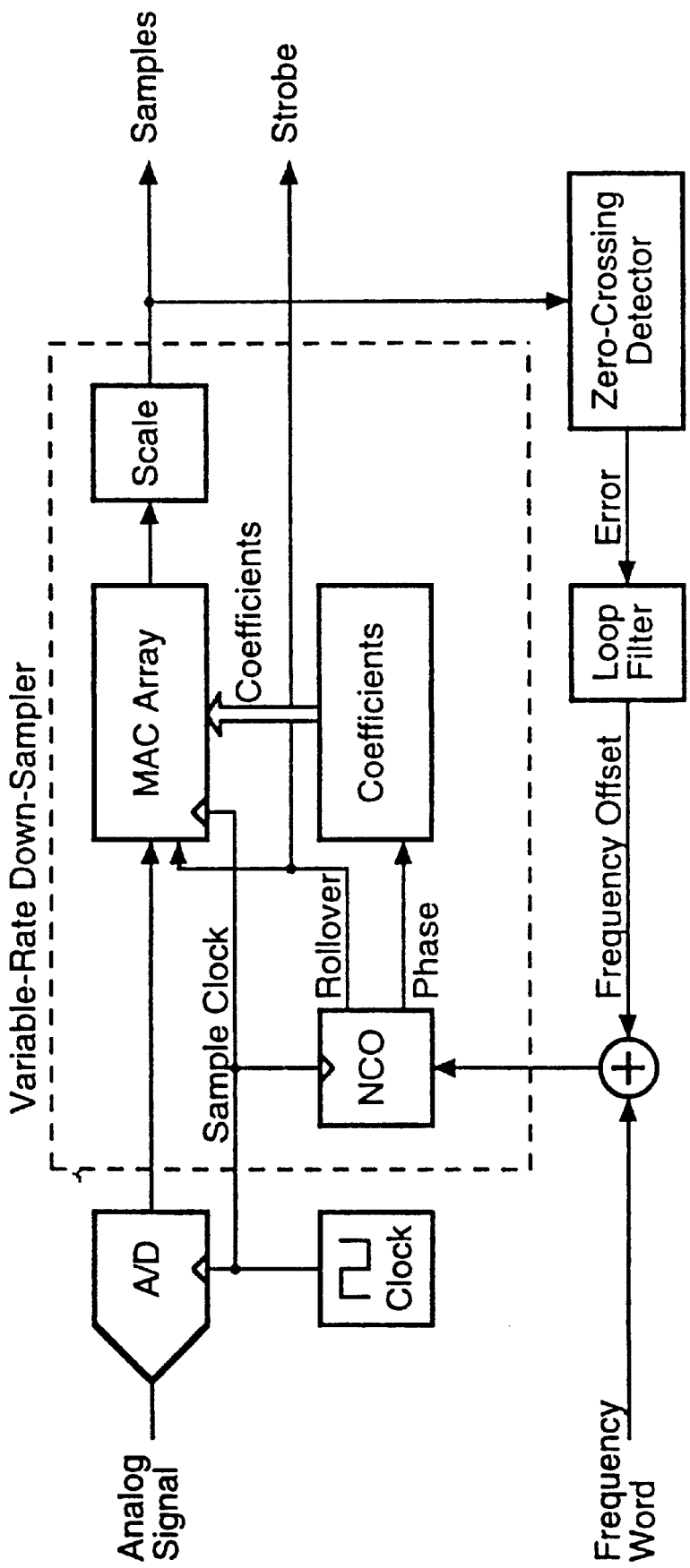
FIG. 5 is a block diagram of the Variable-Rate Down-Sampling Filter of FIG. 1a–1d used in a Timing Recovery Loop.

Timing Recovery Loop Example (FIG. 5)

FIG. 5 illustrates the use of the Variable-Rate Down-Sampling Filter of the present invention in a timing recovery loop. A fixed-frequency master clock CLK provides timing to the Variable-Rate Down-Sampling Filter and an A/D converter. The Variable-Rate Down-Sampling Filter receives digitized samples from the A/D converter at the sampling frequency $F_s$. The Filter's NCO is programmed for a nominal center frequency close to the desired output sample rate $F_o$. The Filter performs its rate conversion and filtering functions and outputs samples. It also outputs the NCO rollover signal, whose frequency is $F_o$, to be used as a strobe by downstream processing functions, in order to indicate when a rate-converted sample is available.

The converted samples are presented to a timing error detector (such as the well-known zero-crossing detector) which produces as an error signal, an estimate of how far (early or late) from the desired sampling instant the converted samples are. The error signal goes to a loop filter (usually a 1st-order low-pass filter) which accumulates the errors and produces an estimate of the frequency offset from the nominal frequency. This offset is added to the nominal center and presented to the NCO as its Frequency Word, thereby closing the loop.

Derivation

The filters in a demodulation process achieve three purposes:

1. to select the desired signal components and suppress unwanted signals within the sampling bandwidth (anti-aliasing),
2. to equalize or compensate for channel conditions and/or to match the transmit wave-shaping;
3. to interpolate sample values between the actual samples.

The last is the primary function of the Variable-Rate Down-Sampling Filter of the present invention, but incidentally the other two functions can be included at the same time. A suitable filter characteristic (selection of coefficients) can be designed that accomplishes all three purposes. The Filter is based on a finite-impulse-response (FIR) filter architecture which calculates the convolution sum:

$$y(n) = \sum_{i=0}^{DM-1} c(i)x(n-i)$$

where:
n=the sampling clock index
y(n) is the output sequence
x(n) is the input sequence
c(i) are the coefficients of the filter's impulse response DM is the total number of coefficients or "taps" in the filter The total number of coefficients is characterized by two parameters D and M in anticipation of reworking the above one-dimensional convolution sum as a two-dimensional sum.

Figure 6:
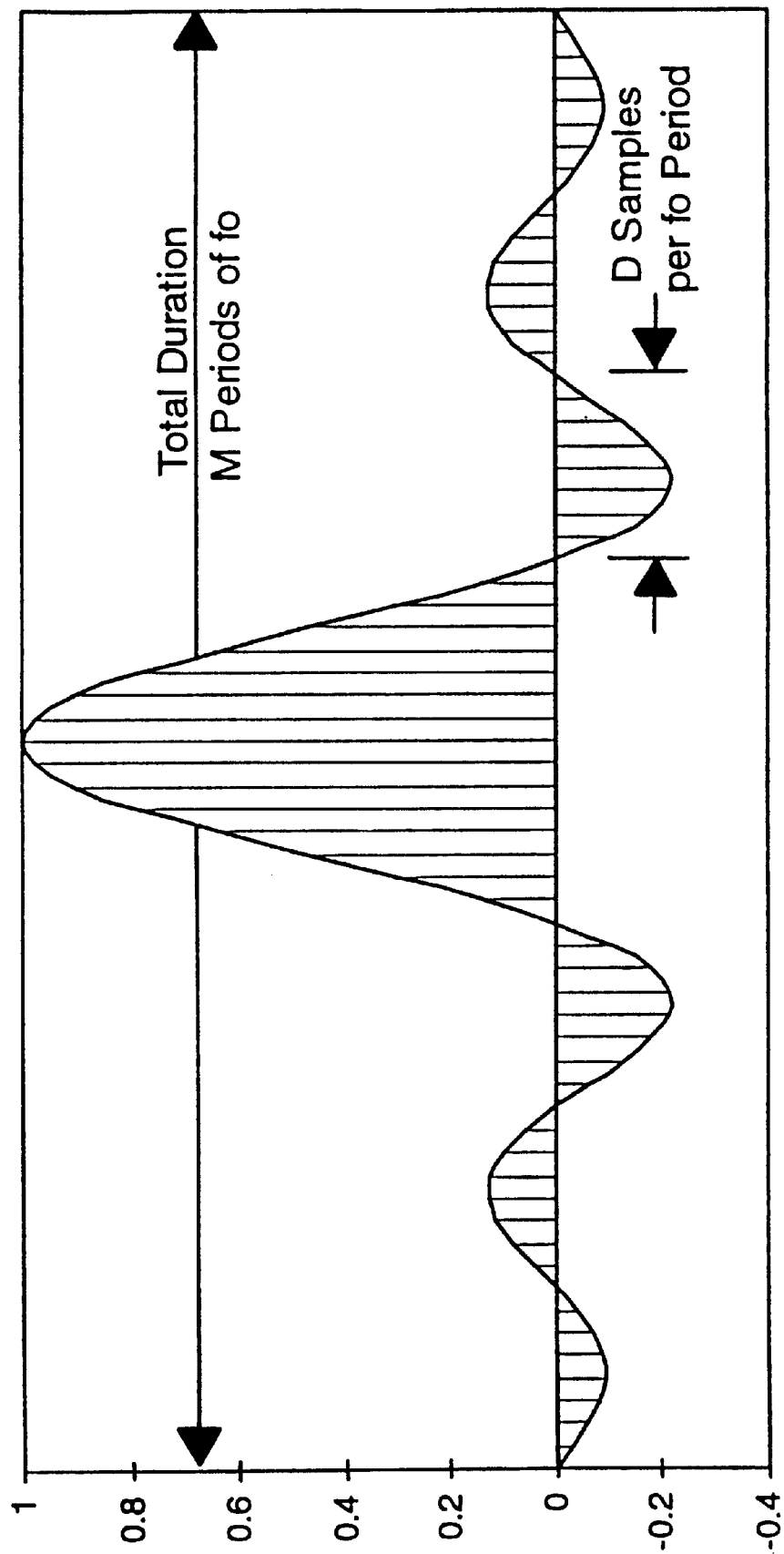
FIG. 6 is a graphical representation of the typical Filter impulse response.

A typical FIR impulse response for a decimate-by-D filter is shown schematically in FIG. 6. A shape like this would be used when the desired output rate Fo is equal to the symbol rate. The nulls are spaced approximately D samples apart and the central lobe contains approximately 2D samples. The details of the structure of the impulse response will vary somewhat according to the functions the filter is intended to accomplish. For example, for an output rate Fo at twice the symbol rate (2 output samples per symbol), the lobes would be twice as wide. Furthermore, in a two-channel system where two downsampling filters are driven by the same NCO, the two channels can have different filter responses, for example, shifted in phase for offset-QPSK demodulation. Although the ideal impulse response theoretically extends to infinity, in reality, it is truncated at some suitable length DM, selected for adequate performance.

At each tick n of the sampling clock, a new value x(n) is presented to the filter, the entire convolution sum of DM coefficients times the last DM samples is calculated, and an output value y(n) emerges. But if the filter is being used to decimate by D, only 1 out of D outputs are needed and the other D−1 outputs of the D outputs are thrown away. Thus there is no need to calculate the other D−1 outputs. Instead, D samples at a time can be presented to the filter and then the sum is calculated. This simplification lends itself to a structure known as the polyphase structure, shown in FIG. 7.

Figure 7:
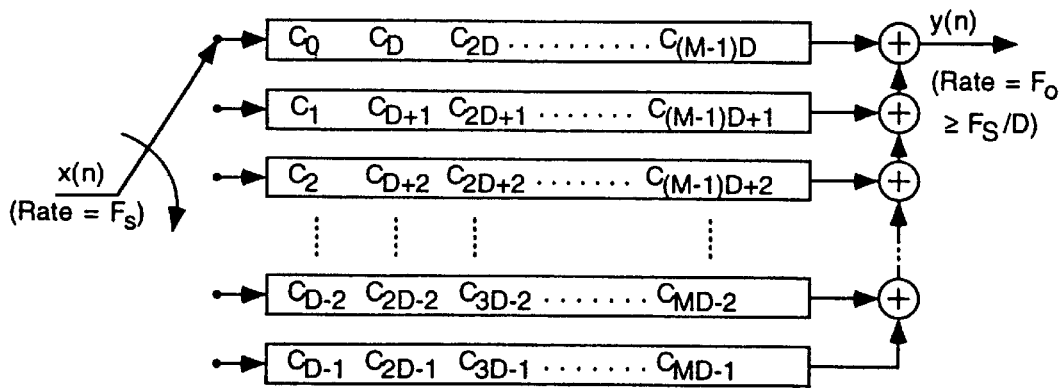
FIG. 7 is a block diagram for the Variable-Rate Down-Sampling Filter of the present invention in a Polyphase Structure.

As shown in FIG. 7, the coefficients are distributed in a matrix, down the columns, then across the rows. There are D rows or phases; each phase is itself an FIR filter with M coefficients. The commutator steps down the rows, distributing one sample each clock tick to each row. It sweeps out the entire array in D ticks and then recycles; at that time the final sum is computed and a new sample is available at the output.

If it were desired to decimate by less than D, for example by D/N, then the commutator skips N rows and delivers samples only to every Nth phase and zeroes to the others. Again a new output would be available when the commutator recycles. If D/N is a fixed integer, then the commutator will hit the same phases every cycle and the other phases can be eliminated. This is equivalent to scaling the original filter impulse response by decimating it, that is, eliminating all the samples except every Nth. If D/N is not an integer, then the commutator will hit a different set of phases on each pass, but eventually the pattern will repeat. Finally, if D/N is not even constant, the commutator will hit a different set of phases each pass, and the pattern may never repeat exactly. But in all cases, the decimated output is available when the commutator recycles. This is the principle behind the Variable-Rate Down-Sampler. The commutator is the phase index of the NCO, which generates a different set of coefficients for each incoming sample. The recycling of the commutator is the rollover of the NCO at the output sample rate. The polyphase segments are collapsed into the Coefficient Generator and MAC array as described below.

Figure 8:
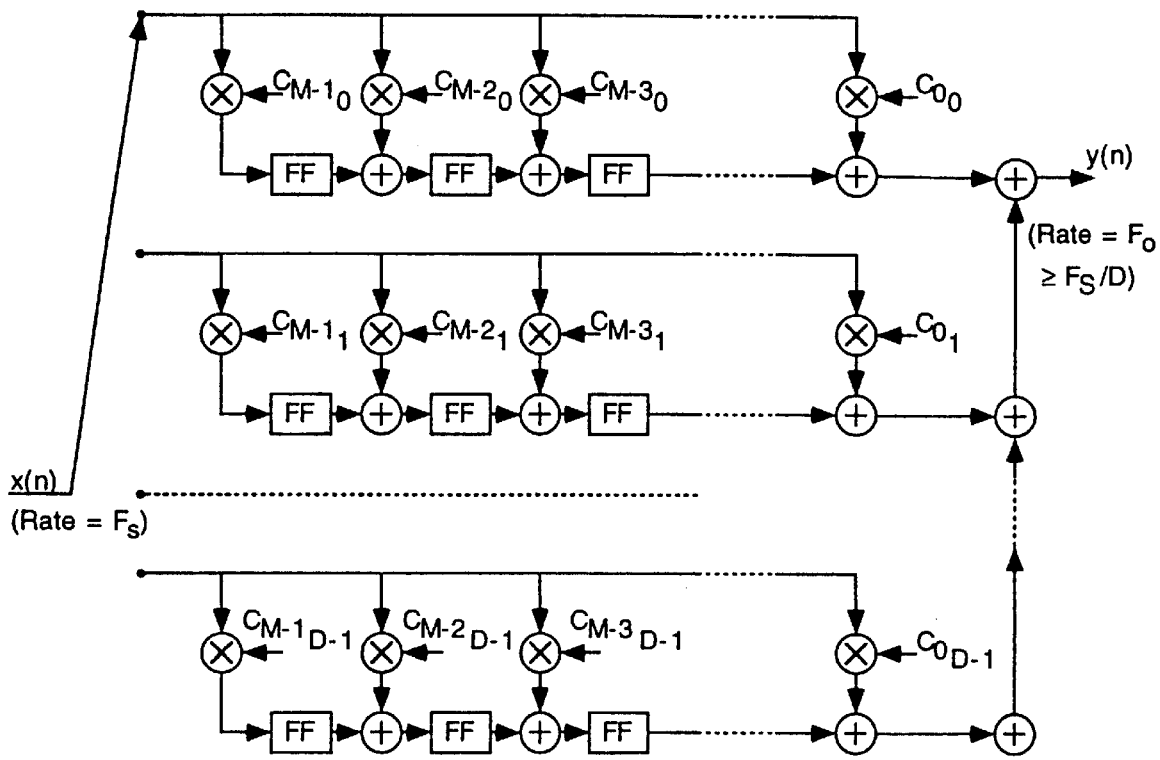
FIG. 8 is a block diagram for the Variable-Rate Down-Sampling Filter of the present invention in a Polyphase Structure showing greater detail than FIG. 7.

First the diagram of the polyphase structure is expanded in FIG. 8 to show the detail of each phase. Since the phases themselves are FIR filters, they can be implemented in the transpose form as shown in FIG. 8. The polyphase representation recasts the one-dimensional sum as a two-dimensional sum:

$$y(n) = \sum_{k=0}^{D-1} \sum_{j=0}^{M-1} c(j,k)x(n-(jD+k))$$

where the original index i has been replaced by the two-dimensional index (jD+k) and the coefficients c(i) have been renumbered with the double index c(j,k). The index j counts cycles of the commutator at rate Fo and the index k counts the phase within each cycle. Each row of the diagram is a phase and it sums up M samples spaced D apart. Here the D samples x(n) for a $F_o$ period are spread by the input commutator, one each to the multipliers of each respective FIR filter, multiplied by the applicable coefficient and stored in the respective register FF at the output of the respective multiplier. When the input commutator recycles back to each FIR filter, each new sample for the next $F_o$ period is multiplied by the same coefficient by the multipliers of the respective FIR filter, added to the contents of the preceding register FF and the result stored in the next register FF. Also on each recycling of the commutator (at the rate $F_s/D$), the new output y(n), representing the sum of the last M cycles of the commutator, is available. In essence, FIG. 8 presents the detail of FIG. 7.

Figure 9:
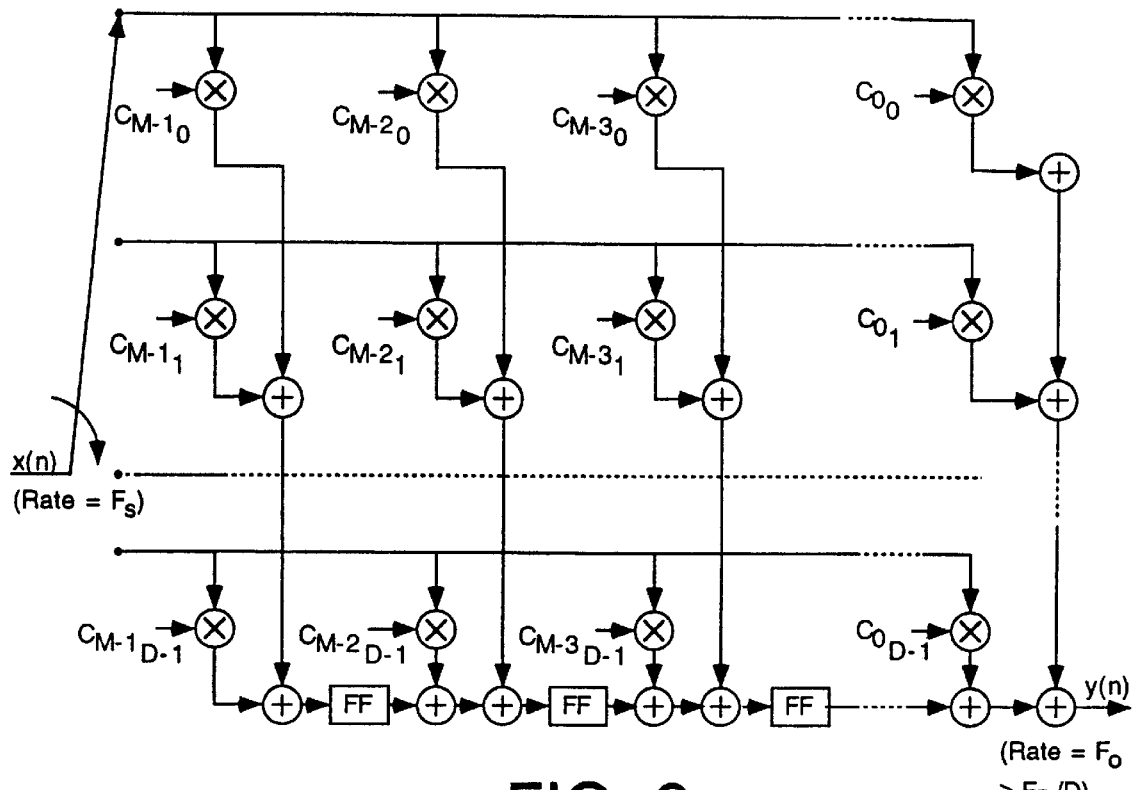
FIG. 9 is a block diagram for the Variable-Rate Down-Sampling Filter of the present invention in a Polyphase Structure with vertical sums.

Since addition is commutative, the sums need not be done horizontally first; they can be done vertically first as each sample arrives, and then horizontally when the commutator recycles, as shown in FIG. 9. This is nothing more than swapping the order of summation in the two-dimensional sum:

$$y(n) = \sum_{j=0}^{M-1} \sum_{k=0}^{D-1} c(j,k)x(n-(jD+k))$$

Figure 10:
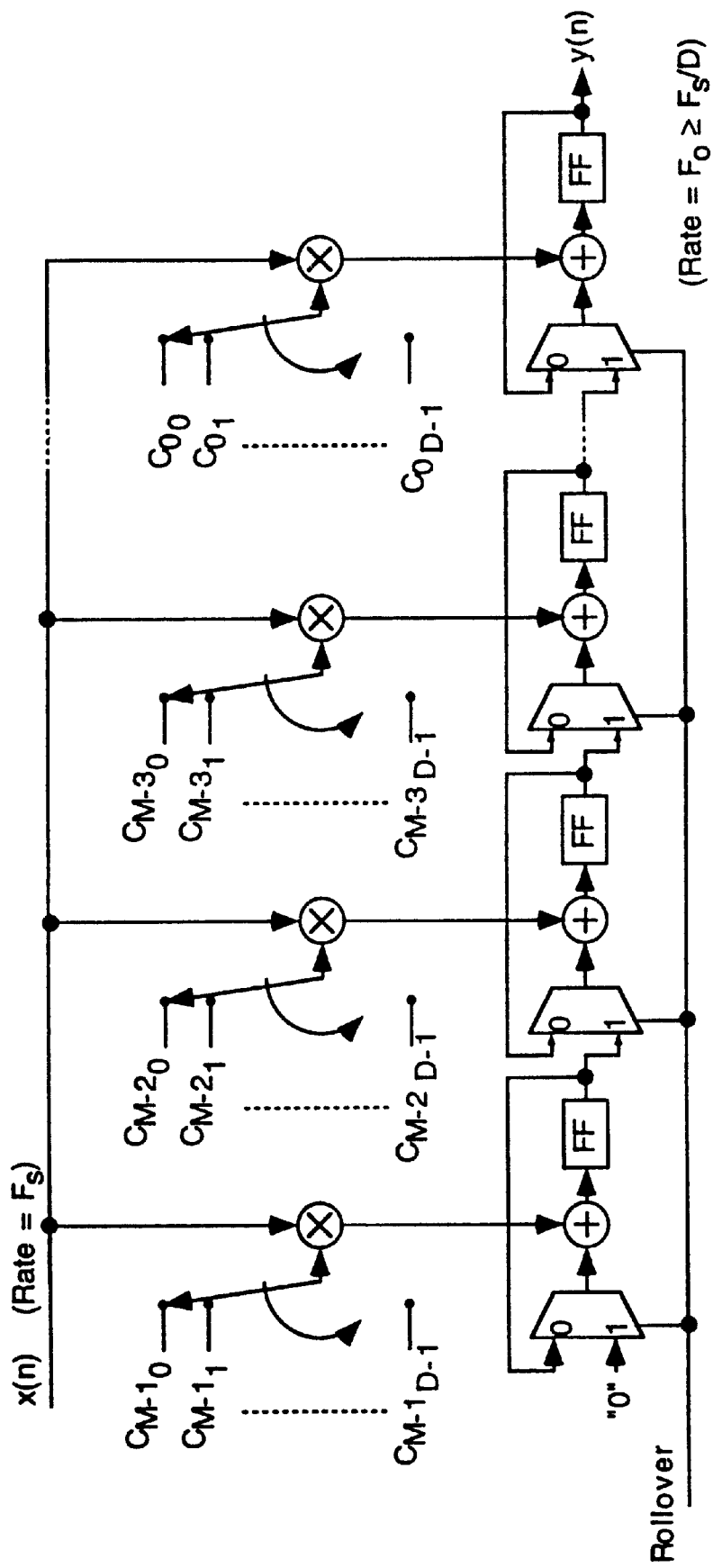
FIG. 10 is a block diagram for the Variable-Rate Down-Sampling Filter of the present invention in the preferred form of a Collapsed Polyphase Structure.

But since the commutator hits only one phase at a time, only one row of coefficients, multipliers, and adders is active at one time, the others get zeroes. So each column of multipliers and adders can be collapsed vertically and replaced by a single multiplier and an accumulator. Only the coefficients change with time, so they can come from a lookup table indexed by the commutator-NCO. The horizontal sum on the bottom row occurs at the rollover when each MAC sum is shifted down to its neighbor. The final form of the MAC array part of the Variable-Rate Down-Sampler is shown in FIG. 10.

There has been described herein, methods and apparatus for variable-rate down-sampling filters for discrete-time sampled systems using a fixed sampling rate providing variable, non-integral, non-rational, resampling ratio (Fo/Fs), wherein a continuous range of output sampling rates can be derived from a fixed input sampling rate, wherein the filter characteristics are automatically scaled to the output sampling rate so only one filter set of characteristic needs to be designed, wherein the design can be scaled in number of stages, depth of coefficient tables, and precision of calculations to meet the requirements of the application, and wherein the filter characteristics, stored as coefficients in tables, can be designed to the requirements of the application, for example, a concatenation of anti-aliasing and pre-distortion/equalization functions, all within a modular architecture suited to VLSI implementation.

Thus while preferred embodiments of the present invention have been disclosed and described in detail herein, it will be obvious to those skilled in the art that various changes in form and detail may be made therein without departing from the spirit and scope thereof.

What is claimed is:

1. In a digital filter, the improvement comprising:
a W bit wide register having a register input, a register output and a sample clock input;
a W bit wide first-adder having first and second first-adder inputs, a first-adder output and a carry output;
a coefficient generator having an address input and a plurality of multi-bit filter coefficient outputs;
the first first-adder input being coupled to receive a frequency word;
the first-adder output being coupled to the register input;
the register output being coupled to the address input of the coefficient generator and to the second first-adder input;
the register clock input being coupled to receive a sample clock signal;
the carry output being coupled to provide a shift control signal;
the address input of the coefficient generator is P bits wide, wherein P is less than W, and wherein only the P most significant bits of the register output are coupled to the address input of the coefficient generator, the coefficient generator storing M times $2^P$ coefficients, M coefficients at each coefficient generator address; and
a plurality M of multiplier-accumulator circuits, each multiplier-accumulator circuit being coupled to receive a respective one of each M filter coefficient outputs of the coefficient generator and a signal sample at the sample clock rate, multiply the same together and accumulate the results in an accumulator, the multiplier-accumulator circuits being coupled in series and responsive to a shift control input to shift the contents of each accumulator in the series of multiplier-accumulator circuits to the accumulator of the next multiplier-accumulator circuit, the contents of the accumulator of the last multiplier-accumulator circuit forming the multiplier-accumulator circuits' output.

2. The improvement of claim 1 wherein each multiplier-accumulator circuit comprises:
a multiplier having first and second inputs and an output, a second-adder having first and second inputs and an output, a register having an input, an output and a register clock input, and a selector having first and second inputs and a selector control;
the multiplier having its first input coupled to a respective coefficient output of the lookup table, its second input coupled to receive signal samples and its output coupled to the first input of the second-adder;
the second-adder having its second input coupled to the output of the selector and its output coupled to the input of the register;
the register having its output coupled to the first input of the selector and to the second input of the selector of the next multiplier-accumulator circuit in the series, and its clock input coupled to the sample clock;
the selector having its control coupled to the shift control input;
the first multiplier-accumulator circuit in the series having the second input of its selector coupled to an initial value, and the last multiplier-accumulator circuit in the series having the output of its register coupled to an output.

3. The improvement of claim 2 wherein the initial value is zero.

4. In a digital filter, the improvement comprising:
a coefficient generator having a phase input and a plurality of filter coefficient outputs, the phase input of the coefficient generator being P bits wide, the coefficient generator producing M times $2^P$ coefficients, M coefficients for each phase value;
a plurality M of multiplier-accumulator circuits, each multiplier-accumulator circuit being coupled to receive a respective one of each M filter coefficient outputs of the coefficient generator and a signal sample at a sample clock rate, multiply the same together and accumulate the results in an accumulator, the multiplier-accumulator circuits being coupled in series and responsive to a shift control input to shift the contents of each accumulator in the series of multiplier-accumulator circuits to the accumulator of the next multiplier-accumulator circuit, the contents of the accumulator of the last multiplier-accumulator circuit forming the multiplier-accumulator circuits' output.

5. The improvement of claim 4 wherein each multiplier-accumulator circuit comprises:
a multiplier having first and second inputs and an output, an adder having first and second inputs and an output, a register having an input, an output and a register clock input, and a selector having first and second inputs and a selector control;
the multiplier having its first input coupled to a respective coefficient output of the coefficient generator, its second input coupled to receive signal samples and its output coupled to the first input of the adder;
the adder having its second input coupled to the output of the selector and its output coupled to the input of the register;
the register having its output coupled to the first input to the selector and to the second input to the selector of the next multiplier-accumulator circuit in the series, and its clock input coupled to the sample clock;
the selector having its control coupled to the shift control input;
the first multiplier-accumulator circuit in the series having the second input of its selector coupled to an initial value, and the last multiplier-accumulator circuit in the series having the first input of its selector coupled to an output.

6. The improvement of claim 5 wherein the initial value is zero or the output of previous multiplier-accumulator circuits.

7. The improvement of claim 4 wherein the coefficient generator is a RAM lookup table.

8. The improvement of claim 4 wherein the coefficient generator is a ROM lookup table.

9. A digital filter comprising:
a numerically controlled oscillator responsive to a clock signal and a numerical control signal to advance its count on each clock signal by an amount determined by the numerical control signal, the oscillator providing as outputs, the present oscillator count at every clock cycle and a rollover signal each time it counts through a predetermined count;
a lookup table having an address input coupled to the present oscillator count output and having a plurality of filter coefficient outputs;
first and second multiplier/accumulator units coupled to the same coefficient outputs of the lookup table, each having a plurality of stages coupled in series, each stage having a multiplier responsive to respective first and second sample inputs for multiplying each of said sample inputs by a coefficient provided by the lookup table, and an accumulator for accumulating the products of the multiplication, the first and second multiplier/accumulator units being responsive to the rollover signal to shift the contents of the accumulator of each stage to the accumulator of the next stage, the last stage of the multiplier/accumulator units being provided as filter outputs.

10. The improvement of claim 9 wherein the lookup table is a RAM.

11. The improvement of claim 9 wherein the lookup table is a ROM.

12. A digital filter comprising:
a numerically controlled oscillator responsive to a clock signal and a numerical control signal to advance its count on each clock signal by an amount determined by the numerical control signal, the oscillator providing as outputs, the present oscillator count at every clock cycle and a rollover signal each time it counts through a predetermined count;
first and second lookup tables, each having an address input coupled to the present oscillator count output and having a plurality of filter coefficient outputs;
first and second multiplier/accumulator units coupled to the coefficient outputs of the first and second lookup tables, respectively, each having a plurality of stages coupled in series, each stage of the first and second multiplier/accumulator units having a multiplier responsive to the respective one of a first and second sample for multiplying respective samples by a coefficient provided by the lookup table, and an accumulator for accumulating the products of the multiplication, the first and second multiplier/ accumulator units being responsive to the rollover signal to shift the contents of the accumulator of each stage to the accumulator of the next stage, the last stage of the multiplier/accumulator units being provided as filter outputs.

13. The improvement of claim 12 wherein the lookup table is a RAM.

14. The improvement of claim 12 wherein the lookup table is a ROM.

15. A digital filter comprising:
a numerically controlled oscillator responsive to a clock signal and a numerical control signal to advance its count on each clock signal by an amount determined by the numerical control signal, the oscillator providing as outputs, the present oscillator count at every clock cycle and a rollover signal each time it counts through a predetermined count;
a coefficient generator having an address input coupled to the present oscillator count output and having a plurality of filter coefficient outputs;
a multiplier/accumulator unit coupled to the coefficient outputs of the coefficient generator having a plurality of stages coupled in series, each stage having a multiplier responsive to the sample input signal for multiplying said sample input by a coefficient provided by the coefficient generator, and an accumulator for accumulating the products of the multiplication, the multiplier/ accumulator unit being responsive to the rollover signal to shift the contents of the accumulator of each stage to the accumulator of the next stage, the last stage of the multiplier/accumulator unit being provided as filter outputs.

16. The improvement of claim 15 wherein the coefficient generator is a RAM.

17. The improvement of claim 15 wherein the coefficient generator is a ROM.

18. In a digital filter, the improvement comprising:
a plurality M of multiplier-accumulator circuits, each multiplier-accumulator circuit being coupled to receive a respective one of each M filter coefficient outputs of a coefficient generator and a signal sample at the sample clock rate, multiply the same together and accumulate the results in an accumulator, the multiplier-accumulator circuits being coupled in series and responsive to a shift control input to shift the contents of each accumulator in the series of multiplier-accumulator circuits to the accumulator of the next multiplier-accumulator circuit, the contents of the accumulator of the last multiplier-accumulator circuit forming the multiplier-accumulator circuits' output.

19. The improvement of claim 18 wherein each multiplier-accumulator circuit comprises:
a multiplier having first and second inputs and an output, an adder having first and second inputs and an output, a register having an input, an output and a register clock input, and a selector having first and second inputs and a selector control;
the multiplier having its first input coupled to a respective coefficient output of the lookup table, its second input coupled to receive signal samples and its output coupled to the first input of the adder;
the adder having its second input coupled to the output of the selector and its output coupled to the input of the register;
the register having its output coupled to the first input of the selector and to the second input of the selector of the next multiplier-accumulator circuit in the series, and its clock input coupled to the sample clock;
the selector having its control coupled to the shift control input;
the first multiplier-accumulator circuit in the series having the second input of its selector coupled to an initial value, and the last multiplier-accumulator circuit in the series having the output of its register coupled to an output.

20. The improvement of claim 18 wherein the initial value is zero.

21. A method of digital filtering to convert digital samples provided at a first sample rate to digital samples at a second sample rate lower in frequency than the first sample rate, where the second sample rate is not necessarily related to the first sample rate in a simple rational way and may be continuously changing, comprising:
using a numerically controlled oscillator (NCO) clocked at the first sample rate to produce (a), a rollover signal at an average rate equal to the second sampling rate, and (b), a phase output equal to the fraction of the period of the second sample rate that has passed since the last rollover, the rollover rate of the NCO being programmable and continuously adjustable by means of a frequency control input;
using the P most significant bits of the NCO's phase output to address a coefficient table containing $2^P$ times M coefficient samples of a finite-impulse-response (FIR) filter, where the coefficient table produces M coefficients simultaneously for each input phase value at each cycle of the first sample rate clock;
using a bank of M cascaded identical multiplier-accumulator stages, for each cycle of the first sample rate clock, to simultaneously multiply each of the M coefficients from the coefficient table by the digital sample presented at the input of the filter, then to add the product of each multiplication to the accumulated sum in each same stage, except when the rollover signal is applied, at which time the multiplication product is added to the accumulated sum of the previous stage, and the final stage outputs its accumulated sum as the converted sample.

22. A digital filter comprising:

a numerically controlled oscillator responsive to a clock signal and a numerical control signal to advance its count on each clock signal by an amount determined by the numerical control signal, the oscillator providing as outputs, the present oscillator count at every clock cycle and a rollover signal each time it counts through a predetermined count;

a coefficient generator having a phase input and a plurality of filter coefficient outputs, the phase input of the coefficient generator being P bits wide, the coefficient generator producing M times $2^P$ coefficients, M coefficients for each phase value;

a plurality M of multiplier-accumulator circuits, each multiplier-accumulator circuit being coupled to receive a respective one of each M filter coefficient outputs of the coefficient generator and a signal sample at every clock cycle, multiply the same together and accumulate the results in an accumulator, the multiplier-accumulator circuits being coupled in series and responsive to the rollover signal to shift the contents of each accumulator in the series of multiplier-accumulator circuits to the accumulator of the next multiplier-accumulator circuit, the contents of the accumulator of the last multiplier-accumulator circuit forming the multiplier-accumulator circuits' output.

23. The improvement of claim 22 wherein each multiplier-accumulator circuit comprises:

a multiplier having first and second inputs and an output, an adder having first and second inputs and an output, a register having an input, an output and a register clock input, and a selector having first and second inputs and a selector control;

the multiplier having its first input coupled to a respective coefficient output of the coefficient generator, its second input coupled to receive signal samples and its output coupled to the first input of the adder;

the adder having its second input coupled to the output of the selector and its output coupled to the input of the register;

the register having its output coupled to the first input to the selector and to the second input to the selector of the next multiplier-accumulator circuit in the series, and its clock input coupled to the clock signal;

the selector having its control coupled to the rollover signal;

the first multiplier-accumulator circuit in the series having the second input of its selector coupled to an initial value, and the last multiplier-accumulator circuit in the series having the first input of its selector coupled to an output.

24. The improvement of claim 23 wherein the initial value is zero.

25. The improvement of claim 22 wherein the coefficient generator is a RAM lookup table.

26. The improvement of claim 22 wherein the coefficient generator is a ROM lookup table.

27. A method for variable-rate down-sampling filtering for discrete-time sampled systems using a fixed sampling rate comprising:

providing a numerically controlled oscillator responsive to a sample clock signal and a numerical control signal to advance its count on each clock signal by an amount determined by the numerical control signal, the oscillator providing as outputs, the present oscillator count at every sample clock and a rollover signal each time it counts through a predetermined count, the present oscillator count being P bits wide;

providing a coefficient generator having a phase input and a plurality of filter coefficient outputs, the phase input of the coefficient generator receiving the present oscillator count of the numerically controlled oscillator, the coefficient generator producing M times 2P coefficients, M coefficients for each phase input;

providing a plurality M of multiplier-accumulator circuits, each multiplier-accumulator circuit receiving a respective one of each M filter coefficient outputs of the coefficient generator and a signal sample at the sample clock rate, multipling the same together and accumulating the results in an accumulator, the multiplier-accumulator circuits being coupled in series and responsive to the rollover signal to shift the contents of each accumulator in the series of multiplier-accumulator circuits to the accumulator of the next multiplier-accumulator circuit, the contents of the accumulator of the last multiplier-accumulator circuit forming the multiplier-accumulator circuits' output.

28. The method of claim 27 wherein each multiplier-accumulator circuit provided comprises a multiplier, an adder, a register and a selector;

the multiplier receiving coefficients from the coefficient generator and signal samples and providing the product thereof as the multiplier output;

the adder receiving the multiplier output and the selector output and providing the sum thereof as the adder output;

the register receiving the adder output and coupling the register output to the first input of the selector and to the second input to the selector of the next multiplier-accumulator circuit in the series, the register having a clock input coupled to the sample clock;

the selector being responsive to the rollover signal to select between its first input and its second input;

the selector of the first multiplier-accumulator circuit having its second input responsive to an initial value, and the last multiplier-accumulator circuit in the series providing an output responsive to the first input of its selector.

29. The improvement of claim 28 wherein the initial value is zero.

30. The method of claim 27 wherein the coefficient generator is a RAM lookup table.

31. The method of claim 27 wherein the coefficient generator is a ROM lookup table.

* * * * *